United States Patent
Bukofsky et al.

(10) Patent No.: US 6,511,791 B1
(45) Date of Patent: Jan. 28, 2003

(54) MULTIPLE EXPOSURE PROCESS FOR FORMATION OF DENSE RECTANGULAR ARRAYS

(75) Inventors: Scott J. Bukofsky, Hopewell Junction, NY (US); Gerhard Kunkel, Radebeul (DE); Richard Wise, New Windsor, NY (US); Alfred K. Wong, Beacon, NY (US)

(73) Assignees: International Business machines Corporation, Armonk, NY (US); Infineon Technologies North American Corp., San Jose, CA (US)

( * ) Notice: Subject to any disclaimer, the term of this patent is extended or adjusted under 35 U.S.C. 154(b) by 0 days.

(21) Appl. No.: 09/561,469

(22) Filed: Apr. 28, 2000

(51) Int. Cl.[7] .................................................. G03F 7/00
(52) U.S. Cl. ..................... 430/311; 430/312; 430/394; 430/396
(58) Field of Search ................................ 430/311, 312, 430/394, 396

(56) References Cited

U.S. PATENT DOCUMENTS

| | | | |
|---|---|---|---|
| 4,702,592 | * 10/1987 | Geiger et al. | 355/53 |
| 5,308,741 | 5/1994 | Kemp | 430/312 |
| 5,563,012 | 10/1996 | Neisser | 430/22 |
| 5,780,188 | * 7/1998 | Rolson | 430/30 |
| 5,815,245 | 9/1998 | Thomas et al. | 355/43 |
| 5,905,020 | * 5/1999 | Hu et al. | 430/394 |
| 5,972,567 | * 10/1999 | Hu et al. | 430/312 |
| 6,042,998 | * 3/2000 | Brueck et al. | 430/316 |
| 6,136,517 | * 10/2000 | Fletcher | 430/394 |
| 6,261,727 | * 7/2001 | Wang | 430/5 |
| 6,278,123 | * 8/2001 | Hu et al. | 250/492.2 |

* cited by examiner

Primary Examiner—Janet Baxter
Assistant Examiner—Amanda C. Walke
(74) Attorney, Agent, or Firm—Graham S. Jones, II; H. Daniel Schurmann

(57) ABSTRACT

A method for exposing a workpiece in a dual exposure step-and-repeat process starts by forming a design for a reticle mask. Deconstruct the design for the reticle mask by removing a set(s) of the features that are juxtaposed to form hollow polygonally-shaped clusters with a gap in the center. Form unexposed resist on the workpiece. Load the workpiece and the reticle mask into the stepper. Expose the workpiece through the reticle mask. Reposition the workpiece by a nanostep. Then expose the workpiece through the reticle mask after the repositioning. Test whether the plural exposure process is finished. If the result of the test is NO the process loops back to repeat some of the above steps. Otherwise the process has been completed. An overlay mark is produced by plural exposures of a single mark. A dead zone is provided surrounding an array region in which printing occurs subsequent to exposure in an original exposure. Alternatively, the workpiece can be fully exposed first by stepping a series of full steps, then going back to the starting position, making a nanostep to reset the starting position and re-exposing from the reset starting position in the same way with full steps from the nanostepped position. The clusters may be in the shape of a hexagon or a diamond.

15 Claims, 8 Drawing Sheets

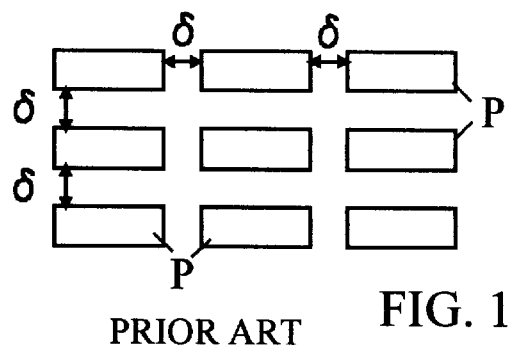
PRIOR ART FIG. 1
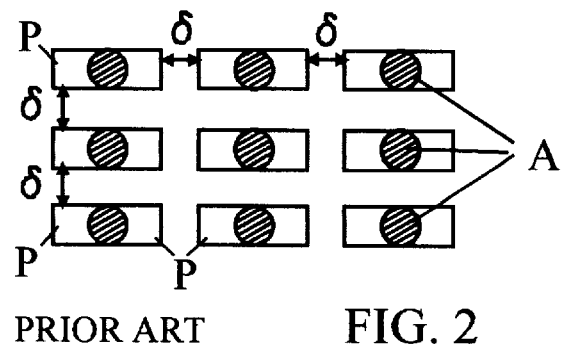
PRIOR ART FIG. 2
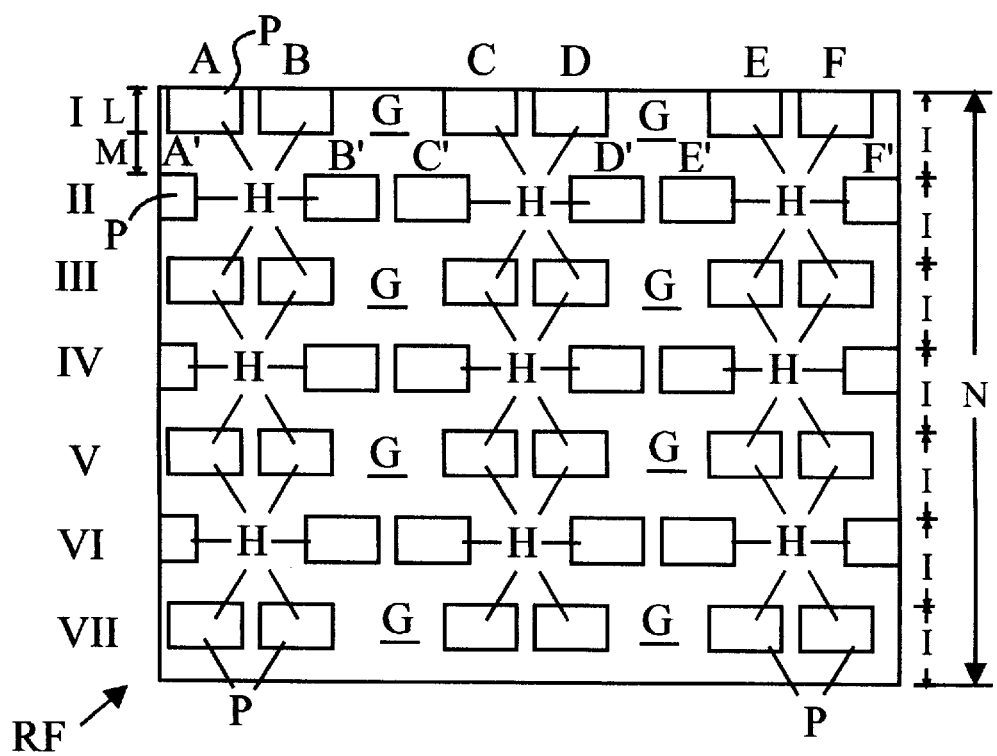
FIG. 3
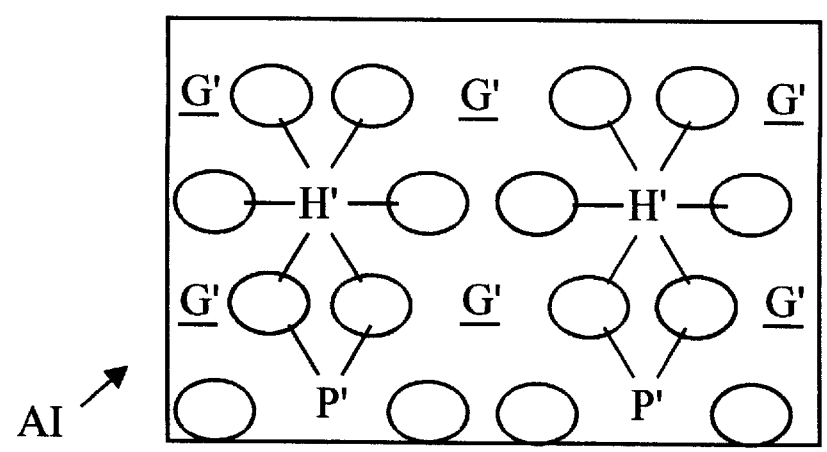
FIG. 4

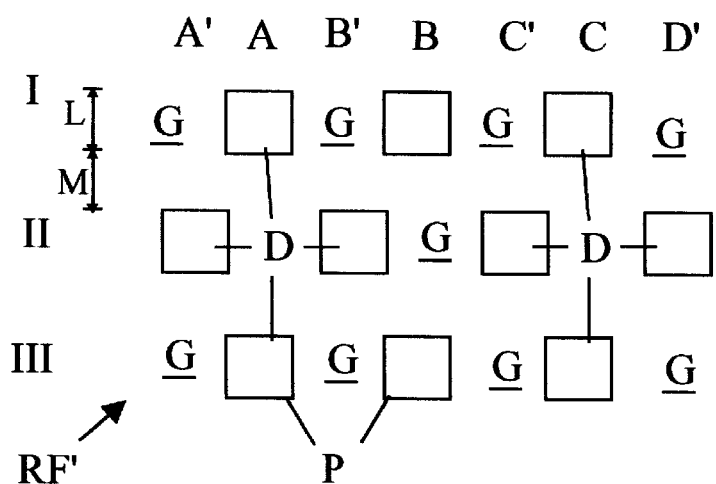
FIG. 6
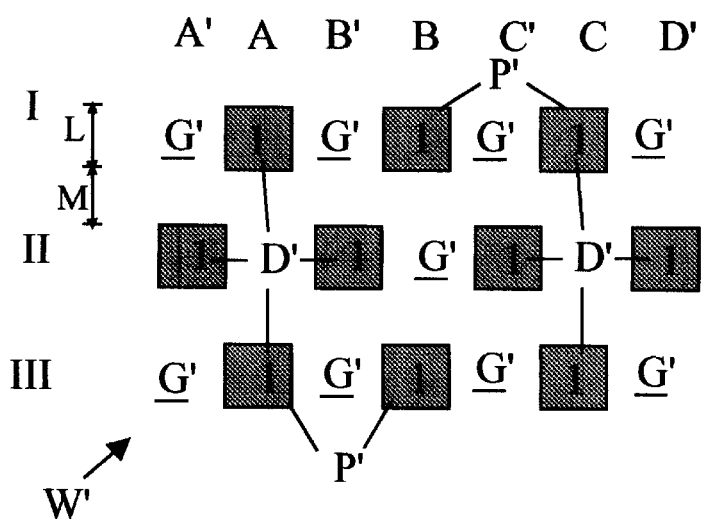
FIG. 7A
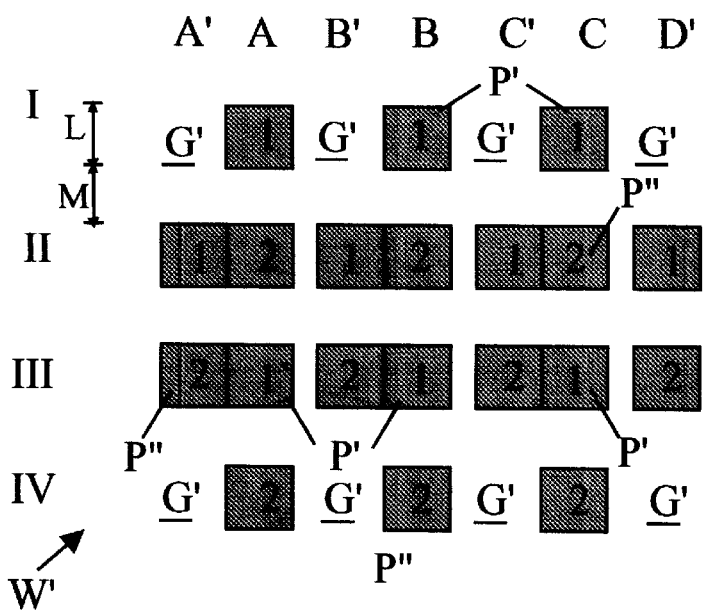
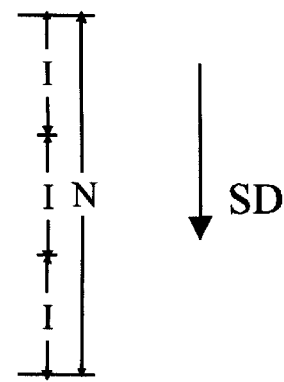
FIG. 7B

MULTIPLE EXPOSURE PROCESS FOR FORMATION OF DENSE RECTANGULAR ARRAYS

CROSS REFERENCE TO RELATED APPLICATION

This application is related to commonly-assigned, copending U.S. patent application Ser. No. 09/561,472 filed on Apr. 28, 2000 of Scott Bukofsky, et al. for PLURAL INTERLEAVED EXPOSURE PROCESS FOR INCREASED FEATURE ASPECT RATIO IN DENSE ARRAYS and subject matter described therein is incorporated herein by reference.

BACKGROUND OF THE INVENTION

1. Field of the Invention

This invention relates to a process for manufacturing semiconductor devices and more particularly to an improved step-and-repeat method of exposing arrays of patterns in the formation of components of integrated circuit semiconductor devices.

2. Description of Related Art

The prior art deals simply with breaking up patterns and putting them on separate masks which is a problem since the reticle mask must be removed from the stepper and the second reticle mask must be inserted to make an exposure.

Examples of multiple exposure processes are shown by Kemp U.S. Pat. No. 5,308,741 and Neisser U.S. Pat. No. 5,563,012. The Neisser patent deals with taking an array and subdividing it into separate overlay masks, followed by forming the final pattern by several exposures using the overlay masks.

U.S. Pat. No. 5,563,012 of Neisser for "Multi Mask Method for Selective Mask Feature Enhancement" describes a method for forming a mask by dividing or grouping pattern shapes into shape groups according to feature types. Two or more overlay masks can contain complementary pattern shapes which are employed sequentially. As stated at Col. 3, lines 46–48, "Thus the entire pattern of the original mask is printed by successive exposure of the overlay mask patterns on to the photoresist." This requires removing a mask and substituting one or more complementary masks for the original mask. A key difference is that the pattern itself is not altered or overlapped, as in this disclosure.

U.S. Pat. No. 5,308,741 of Kemp for "Lithographic Method Using Double Exposure Techniques, Mask Position Shifting and Light Phase Shifting" describes a method of "using double exposures, physical mask shifting and light phase shifting to form masking features on a substrate masking layer. A first Phase Shifting Mask (PSM) is used to form at least one image by exposing a mask at a first location. A second exposure is made using either a second PSM or reusing the first PSM. The PSM used in the second exposure is positioned to partially overlap the original position of the first PSM. If the first PSM is reused, it is shifted to a second exposure position. In either case, in the second exposure the regions of the substrate with first and second exposures have some common unexposed regions which are used to form the masking features. If the first mask is reused it can be shifted by a rectilinear or rotational displacement into the second position. After removal of the exposed resist there are a plurality of unexposed regions on the substrate.

U.S. Pat. No. 5,815,245 of Thomas et al. for "Scanning Lithography System with Opposing Motion" describes a scanning photolithography system which uses opposing motion of a reticle and a blank to compensate for image reversal by a projection system such as a conventional Wynne-Dyson optical system which forms a reverted image on a blank. During scanning the reticle moves in a direction opposite to the direction in which the blank moves. Linear motors are used. See Col. 14, lines 16–20, where it is stated "Typically, relative motion is provided by a microstepper or other precision motor driving the secondary stage under control of a conventional control mechanism receiving feedback from the reticle alignment system."

One of the most severe problems for shrinking down existing designs is the impact of line shortening and the problem is exacerbated for smaller ground rules, because of the effects of resist diffusion, corner rounding, mask making, etc.

SUMMARY OF THE INVENTION

Dense and small patterns suffer from the problem of line shortening and pattern fidelity. This makes it difficult or impossible to maintain the shape of the pattern. This invention shows novel polygonally-shaped pattern layouts, based on nano-stepping, that not only reduce line shortening but also improve pattern fidelity to such a degree that it exceeds the pattern fidelity obtainable with single exposure techniques.

In accordance with this invention, a method for exposing a workpiece in a dual exposure step-and-repeat process starts by forming a design for a reticle mask. Deconstruct the design for the reticle mask by removing a set(s) of the features that are juxtaposed to form hollow polygonally-shaped clusters with a gap in the center. Form unexposed resist on the workpiece. Load the workpiece and the reticle mask into the stepper. Expose the workpiece through the reticle mask. Reposition the workpiece by a nanostep. Then expose the workpiece through the reticle mask after the repositioning. Test whether the plural exposure process is finished. If the result of the test is NO the process loops back to repeat some of the above steps. Otherwise the process has been completed. An overlay mark is produced by plural exposures of a single mark. A dead zone is provided surrounding an array region in which printing occurs subsequent to exposure in an original exposure. Alternatively, the workpiece can be fully exposed first by stepping a series of full steps, then going back to the starting position, making a nanostep to reset the starting position and re-exposing from the reset starting position in the same way with full steps from the nanostepped position. The clusters may be in the shape of a hexagon or a diamond.

BRIEF DESCRIPTION OF THE DRAWINGS

The foregoing and other aspects and advantages of this invention are explained and described below with reference to the accompanying drawings, in which:

FIG. 1 shows a small portion of an original desired Deep Trench (DT) reticle mask layout for one exposure field of a $6M^2$ DRAM cell comprising a portion of an array of three vertical columns by three horizontal for the capacitors.

FIG. 2 is a schematic diagram showing an array of narrow rectangular patterns in a reticle mask which were intended to produce an identical pattern in the photoresist with an array of circular imaged patterns which were produced superimposed thereon.

FIG. 3 shows a dual exposure reticle mask layout, with hexagonally-shaped clusters of patterns, adapted for used in a dual exposure process.

FIG. 4 shows a schematic diagram of an aerial image of a simulation of the result of a single exposure with a portion of the reticle mask of FIG. 3.

FIGS. 6, 7A and 7B show an alternative embodiment of this invention in which the hexagonally-shaped clusters of patterns of FIGS. 4, 5A and 5B are replaced by diamond-shaped clusters of patterns.

DESCRIPTION OF THE PREFERRED EMBODIMENT

Figure 5A:
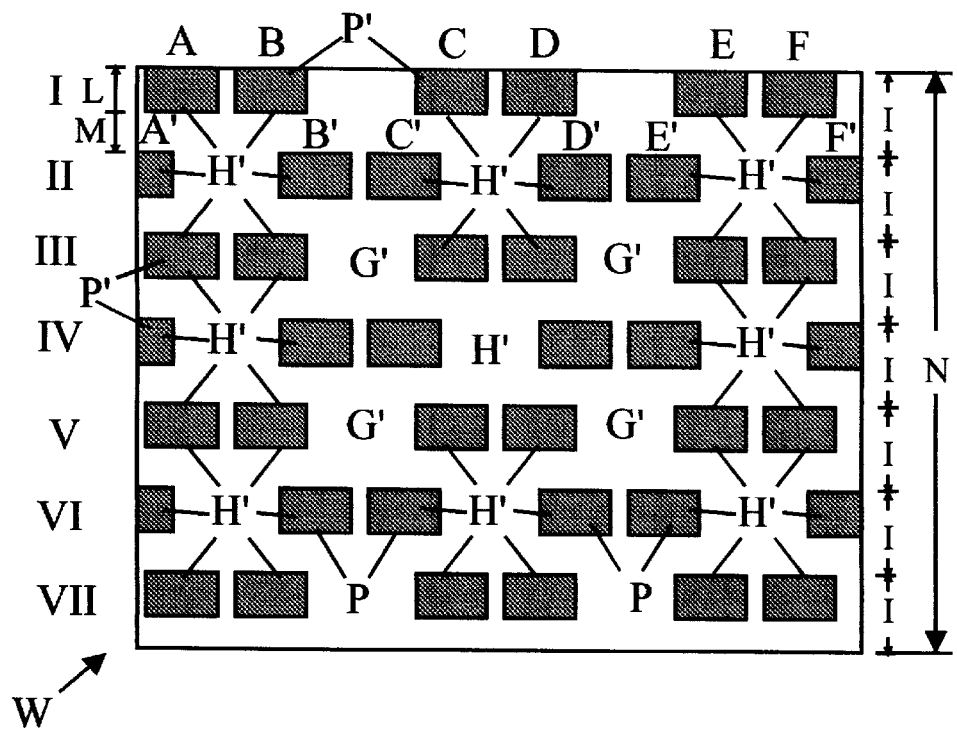
FIGS. 5A and 5B illustrate the results of use of the dual (plural) exposure process of this invention with the mask of FIG. 3 to form a final desired pattern by "nanostepping".

This invention deals with the imaging of dense arrays of patterns, such as shown in FIG. 1. FIG. 1 shows a desired pattern for an array of rectangles to be produced for use in an integrated circuit electronic device. For example, FIG. 1 represents an array found on a reticle mask, consisting of rectangularly-shaped clear features P on an opaque background. These patterns are of crucial importance in semiconductor manufacturing, and are used in many different technologies such as the capacitor level in trench-based DRAM cells, electrode patterns in stacked capacitor DRAMs, contact arrangements in DRAM, microprocessors, and many others.

This pattern layout is extremely difficult to image, especially as feature sizes and product ground rules become smaller and smaller. Because of the extremely small features P and distances "67" between the features P in FIG. 1, this pattern generally images with poor contrast and a great deal of line shortening. Thus, the design shown in FIG. 1 typically prints as small round holes A as shown in FIG. 2 which is a schematic diagram of an actual imaged pattern produced by exposure of a photoresist mask from a reticle with the array of features P shown in FIG. 1.

This invention overcomes all of the above-mentioned problems, allowing very dense arrays of features P to be patterned with large image contrast and fidelity, as well as a minimum of line shortening.

In accordance with this invention, a nano-stepping method is shown, which gives unprecedented pattern fidelity for periodic patterns like Deep Trench (DT) integrated circuit devices.

Reticle Mask Based on Deconstruction of Array into Hexagonal Clusters

FIG. 3 shows a layout of a staggered array of hexagonal clusters H of rectangles forming a reticle mask RF with an array of rectangular patterns P arranged in diagonally staggered, polygonal clusters H of patterns P surrounding a gap G where a pattern P has been omitted from the array in accordance with this invention. In particular, in FIG. 3, the patterns P are arranged in a number of hexagonal clusters H in accordance with this invention. The reticle mask RF comprises an attenuated PSM (Phase Shift Mask). There are substantial gaps G located between the clusters H.

In FIG. 3, the rectangular patterns P have a length of L and they are spaced apart by the vertical distance M. The horizontal distance (interval) "I" along the y axis at which patterns P repeat is as follows:

$$I=L+M$$

The width of the field shown in FIG. 3 is N where N is defined for the seven rows I–VII as follows:

$$N=7I=7L+7M$$

Assume in FIG. 3 that the relative motion imparted by the stepper stage with respect to reticle mask RF is from top to bottom so that it will expose the field shown with its height N and then the stepper will move to expose the next field to the below of row VII.

This invention involves breaking up the desired field of patterns P to be exposed shown in FIG. 1 into a more sparse array as seen in FIG. 3. The final array of patterns P in the field produced in FIG. 5B, as described below, is formed from two exposures.

FIG. 4 shows a schematic diagram of an aerial image AI of a simulation of the result of a single exposure with a portion of the reticle mask RF of FIG. 3. The clusters H' of elliptical patterns P' are produced with gaps G' therebetween. The aerial image AI is shown for a contact-like pattern. The pattern of aereal image AI of FIG. 4 corresponds to a 6M² cell design based on a 150 nm ground rule.

Figure 8:
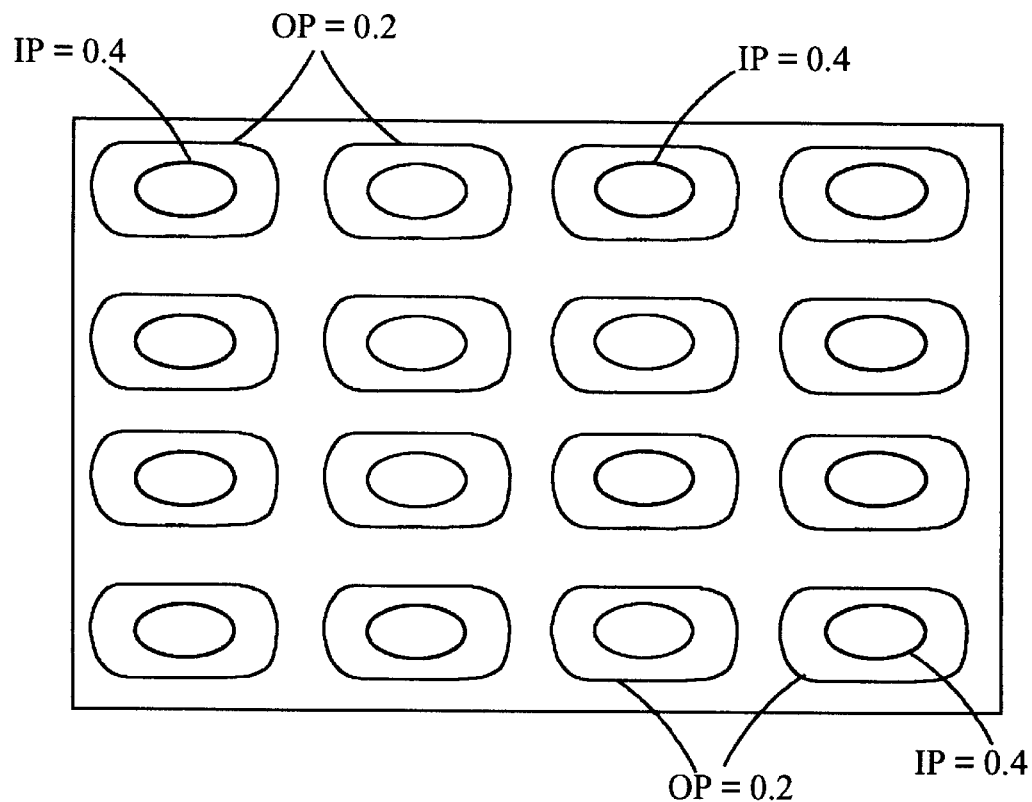
FIG. 8 shows an aerial image based upon a simulation of the result of nano-stepping based on a modification of FIG. 4 using the nanostepping double exposure method.

If the same reticle mask RF is exposed a second time, but shifted by 2M (=300 nm) in the y-direction in FIG. 3 by nano-stepping, it results in a nested contact pattern with reduced line shortening and rectanglar-like shapes. FIG. 8 shows an aerial image based upon a simulation of the result of such nano-stepping is shown in which is a modification of FIG. 4 based upon a double exposure with an offset of 300 nm for the second exposure. The simulation in FIG. 8 shows the power of the method of this invention for levels which suffer from line shortening. Note the straight lines along the long dimension of the contact.

Figures 9A, 9B:
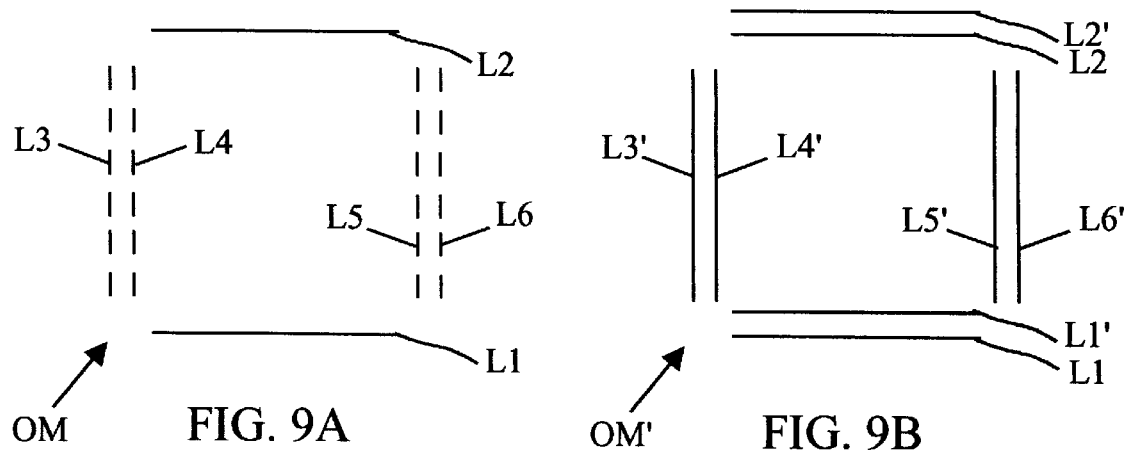
FIG. 9A shows an original overlay mark produced by a reticle mask during the first exposure of a workpiece with solid lines at the top and bottom and dotted lines on the left and right.
FIG. 9B shows the overlay mark of FIG. 9A after a nanostep along the y-axis (vertical direction) and re-exposure of the workpiece through the reticle mask.

FIGS. 9A and 9B show an example of how the process of this invention forms a composite overlay mark OM/OM' by dual sequential exposures before and after a nanostep.

Figure 5B:
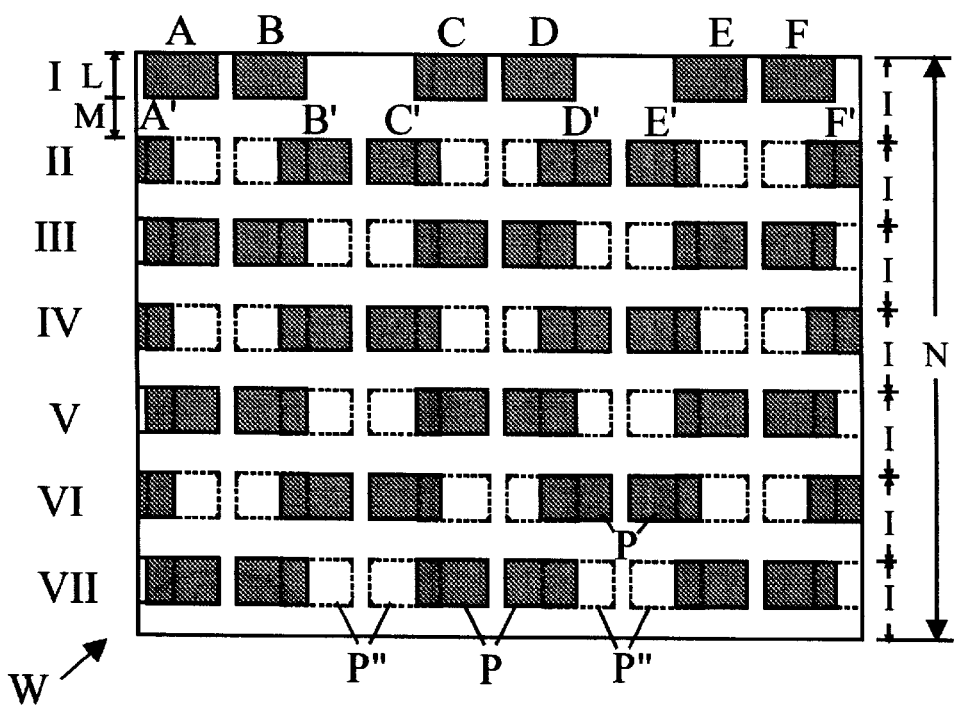

FIGS. 5A and 5B illustrate the results of use of the dual (plural) exposure process of this invention with the mask of FIG. 3 to form a final desired pattern in accordance with this invention by "nanostepping" in which distances of stage movement are quite small compared with typical stage movements during wafer exposure in which the reticle mask is moved the full length of the reticle mask between exposures in what is referred to as a full step. That is to say that the array of FIG. 3 is exposed a second time with a stage shift, as shown in FIGS. 5A and 5B. The final pattern seen in FIG. 5B is the desired array with a pattern similar to FIG. 1.

FIG. 5A shows a workpiece W which has been exposed to only the first exposure in a first position to a field of a diagonally-staggered array of hexagonal cluster H of patterns P on the dual exposure reticle RF of FIG. 3 in accordance with this invention. The result is the matching diagonally-staggered array of hexagonal cluster H' of patterns P' exposed upon the workpiece W.

Subsequent to the first exposure shown in FIG. 5A, instead of moving the entire height of the field of the reticle mask RF, the exposure tool stage is then moved an ultra small "nanostep" and exposed again to fill in the remaining patterns P''' as shown in FIG. 5B. As is well known by those skilled in the art, the "stage" is the portion of the tool upon which the workpiece W is located during exposure. The stage is precisely moved by a precision stepper motor by a conventional commercially available step-and-repeat machine of the kind well known by those skilled in the art programmed to move the workpiece W relative to the reticle mask RF in accordance with this invention. The stepper motors are designed for stepping the tool from a first field to be exposed in a first position to a second field to be exposed at a second adjacent position in a step-and-repeat sequence of exposures and steps where each new field is immediately adjacent to the preceding field.

FIG. 5B shows the workpiece W of FIG. 5A after a second one of the dual exposures to the field of patterns P''' (shown by dotted lines, i.e. in phantom) on the reticle mask RF which in this case have been exposed in a second position an interval "I" away from the first exposure. This completes the dual-interleaved exposure process of the first field of a series of fields to be exposed by a stepper in the dual exposure process in accordance with this invention. Thus, FIG. 5B shows a field of patterns P' and P''' which have been exposed in both the first and the second of two exposures in a dual exposure process in accordance with this invention.

Referring again to FIG. 3 the patterns P for rows II, IV and VI have been staggered from left to right by about 1.5 times the length of a rectangle P. There are gaps G (empty spaces in the array) from which rectangles P have been omitted from the reticle mask RF around the hexagonal clusters H. In addition, the center of each cluster H of patterns P has a gap which is in fact equivalent to gap G for another cluster centered by an adjacent gap G. Actually the gaps G are the centers of diagonally staggered hexagonally-shaped clusters, but for the purposes of clarifying the description of the patterns, they are marked as gaps G. Thus the clusters are diagonally staggered from the lower left to the upper right or from the upper left down to the lower right. In the position shown, the reticle mask RF of FIG. 3 can expose the pattern shown, but with gaps in row I between Col. B and Col. C and between Col. D and Col. E; row II between Col. A' and Col. B' and between Col. C' and Col. D' as well as between Col. E' and Col. F' and so forth below. Note that Col. A' is one half length of a rectangle to the left of Col. A but Col. B' is one column to the right of column B, and so forth for Col. C', D', E' and F' as is shown in FIG. 3.

Referring again to FIG. 5A, the workpiece W is shown after having received an exposure that is the result of the first exposure with the reticle mask RF of FIG. 3 in its initial position relative to the workpiece W in FIG. 5A. To complete the exposure of a single field as shown in FIG. 5B requires repeating the use of the reticle mask RF of FIG. 3 only after the relative position of the workpiece W and reticle mask RF has been nanostepped (moved) by the distance "I" (i.e. vertical (y-axis) interval "I") to a second position. The nanostepping movement to the second positions requires movement by the extremely small distance "I" instead of the distance N as is required in the Prior Art method to complete exposure of all of the patterns P of the field as shown in the related, copending Bukofsky U.S. patent application Ser. No. 09,561,472. In the second exposure position, reticle mask RF is employed to expose the complementary patterns P''' in the centers of clusters H' and in the gaps G' of FIG. 5A to produce the pattern seen in FIG. 5B.

Then after the exposure of patterns P' for clusters H', the relative position of reticle mask RF with respect to the workpiece W must move the distance N–I to expose the centers of clusters H' and the gaps G' of the next field which is to be exposed. The movement of the reticle mask RF relative to the workpiece W by the distance N is a full step. The movement of the reticle mask RF relative to the workpiece W by the distance "I" is referred to herein as a "nanostep" (stutter-step) which is done by operating the stepper alternately first taking a nanostep moving after the first exposure in FIG. 5A the distance "I", then taking a full step moving the distance "N–I" after the first exposure in FIG. 5B, then again nanostepping the distance "I" in the nanostepping mode. Later, if necessary, the stepper continues to operate taking a full step "N–I" followed by another nanostep "I" and so forth in what could be referred to as alternate steps and (nano) steps. To reproduce the original reticle mask RF of FIG. 3 by the method of this invention, as described above for reticle mask RF of FIG. 3, after producing the result shown in FIG. 5A the reticle mask RF is nanostepped to fill in the additional column producing the result seen in FIG. 5B.

FIG. 9A shows an original overlay mark OM produced by a reticle mask during the first exposure of a workpiece with lines L1, L2 at the top and bottom and dotted lines L3 and L4 on the left and dotted lines L5 and L6 on the right.

FIG. 9B shows the overlay mark of FIG. 9A after a nanostep along the y-axis (vertical direction) and re-exposure of the workpiece through the reticle mask (not shown). The resultant composite image of FIG. 9B is identical to the traditional image. The lines L1 and L2 at the top and bottom have been supplemented by lines L1' and L2' above lines L1 and L2 respectively. The dotted lines L3 and L4 on the left and dotted lines L5 and L6 on the right have been replaced by solid lines L3' and L4' on the left and dotted lines L5' and L6' on the right since the dotted lines complement the dotted lines to produce the solid lines in the overlay mark OM'.

Figure 10A:
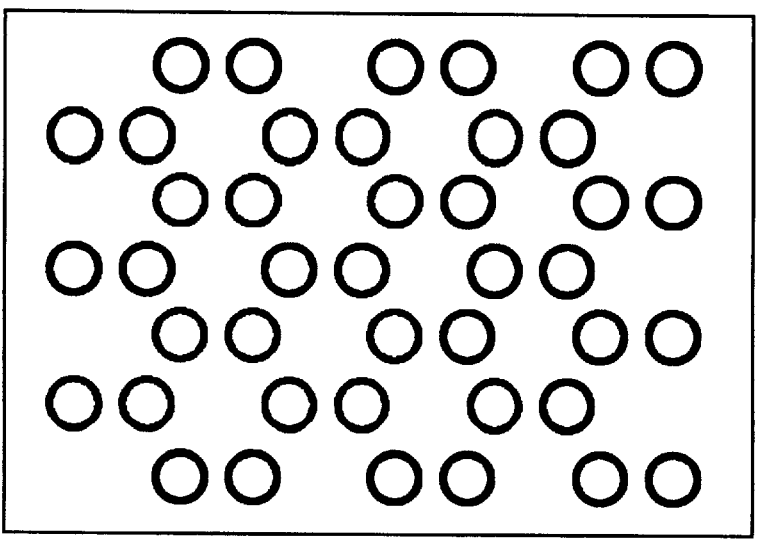
FIGS. 10A–10C are schematic representations of the result of patterning workpieces manufactured using the reticle mask of FIG. 3 which illustrate the results of employing this invention.
Figure 10B:
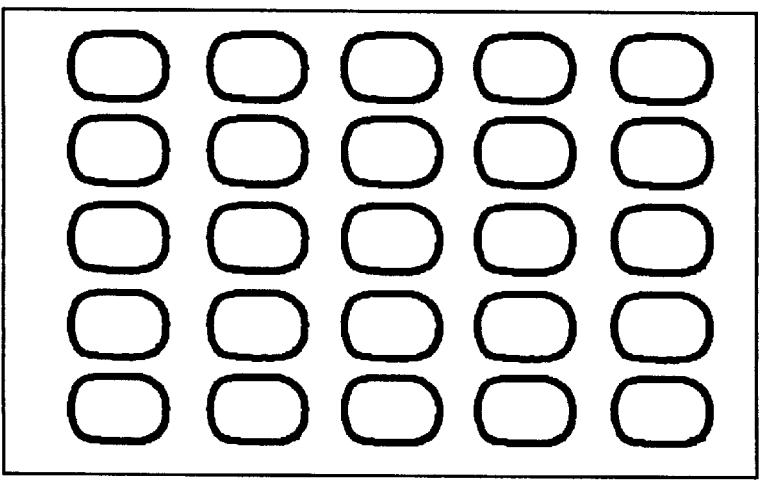
Figure 10C:
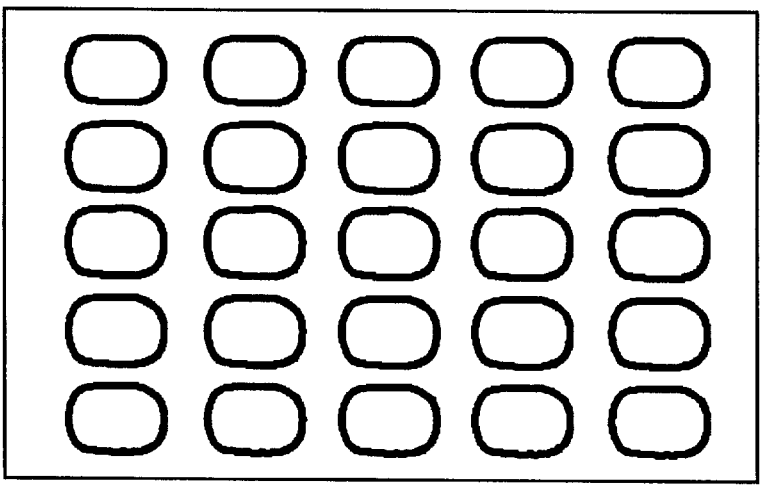

FIGS. 10A–10C are schematic representation of the result of patterning workpieces manufactured using the reticle mask of FIG. 3 which illustrate the results of employing this invention. FIG. 10A shows the results of employing the mask with only a single exposure. FIG. 10B shows the results for a double exposure after lithography. FIG. 10C shows the results from use of the double exposure process after etching. Depicted are experimental results printed in resist with and without double exposure technique.

FIG. 10A is derived from a single exposure using a mask pattern of the kind shown in FIG. 3. FIG. 10B is derived from a double exposure with a shift along the y-axis of 300 nm resulting in a dense rectangular pattern. FIG. 10C is derived from the same pattern as FIG. 10B after a 400 nm oxide etch. FIG. 10A and FIG. 10B show that this method is useful especially when reduced line shortening and dense pattern are required. It is scalable down to the resolution limit of KrF.

This invention creates dense arrays as discussed above by utilizing multiple exposures. Referring to FIG. 5A, employing the reticle mask RF of FIG. 3, a pattern is created that forms a sparse array of rectangular features P. After the first exposure, the printed image shown with idealized rectangular features P in FIG. 5A actually resembles the pattern of features P' seen in the aerial image AI of FIG. 3 which is derived from reticle mask RF of FIG. 4. In order to form the final pattern, the array of shapes in FIGS. 3 and 4 is exposed a second time, with a pattern shift in the y-direction in this example by a distance M. This causes overlap of the rectangular patterns P' in such a way that the final dense rectangular array is formed, as schematically shown in FIG. 5B.

An example of this performed on an actual wafer is shown in the above-identified related application of copending Bukofsky, et al., Ser. No. 09/561,472. Images formed in this fashion have a much higher contrast and less image shortening than was achieved heretofore. Other arrangements are possible to produce the same final image, such as shown by the reticle mask RF' in FIG. 6. The key aspect in all of these embodiments of the concept of nanostepping of arrays which have been deconstructed is the notion of forming a dense array by multiple overlapped exposures of sparse arrays.

FIGS. 6, 7A and 7B show an alternative embodiment of this invention in which the hexagonally-shaped clusters H of FIGS. 4, 5A and 5B are replaced by diamond-shaped clusters D.

FIG. 6 shows an alternative arrangement of the pattern elements P in reticle mask RF' as an alternative to FIG. 3 for use in a dual exposure reticle mask RF'. In FIG. 6 a reticle mask RF' has been designed with alternate features omitted in a diamond-shaped, checkerboard pattern from rows II, IV and VI of columns A, C and E and rows I, III and V of columns B and D. The pattern of diamond-shaped patterns D formed by four patterns P with one on the top, one on the bottom and one each on the left and the right. Between the four patterns P in each diamond is a gap or a hollow space G. Actually where the gaps G are indicated it can be seen that another diamond shape is provided. The diamonds are located laterally, vertically and diagonally in this array. The rows of square patterns P are staggered in the same way that a checkerboard is staggered with the patterns P comprising the light squares of the checkerboard with the gaps comprising the black squares of the checkerboard. The gaps G are in the centers of the diamonds D' but are shown alternately for purposes of explanation even though each gap G' is simply the center of a diamond D.

FIGS. 7A and 7B show a workpiece W' which has been exposed by the reticle mask RF' with the arrangement of pattern square elements P which are in the positions produced on workpiece W'.

FIG. 7A shows a workpiece W' which has been exposed once by the reticle mask RF' with a diamond-shaped, checkerboard pattern D' of square elements P' adapted for use with the dual exposure method of this invention. The squares which have been exposed are marked "1" for the first exposure. Again, the gaps G' are in the centers of the diamonds D' but are shown alternately for purposes of explanation even though each gap G' is simply the center of a diamond D'.

FIG. 7B show the workpiece W' of FIG. 7A after re-exposure of the workpiece through the reticle mask RF' with diamond-shaped pattern D' after a nanostep along the y-axis in direction SD with the same checkerboard pattern of square elements employing the dual exposure method of this invention exposing square elements P". In FIG. 7B, after nanostepping downwardly (or upwardly, to the right, or the left) the empty spaces in the checkerboard pattern of FIG. 7A are filled with the elements P" which are marked "2" for the second exposure. Patterns "2" fill most of the gaps G' except at the very periphery of the mask, which is not a problem in the kind of massive array employed in contemporary devices.

The difference from the modified checkerboard arrangement of the copending related application is that the square features P' and P" overlap or are tangent thereby joining a feature P' with a feature P" to produce generally rectangular features "1-to-2" or "2-to-1" as seen in FIG. 7B.

Preparation of Plural Exposure Reticle Mask

Figure 11:
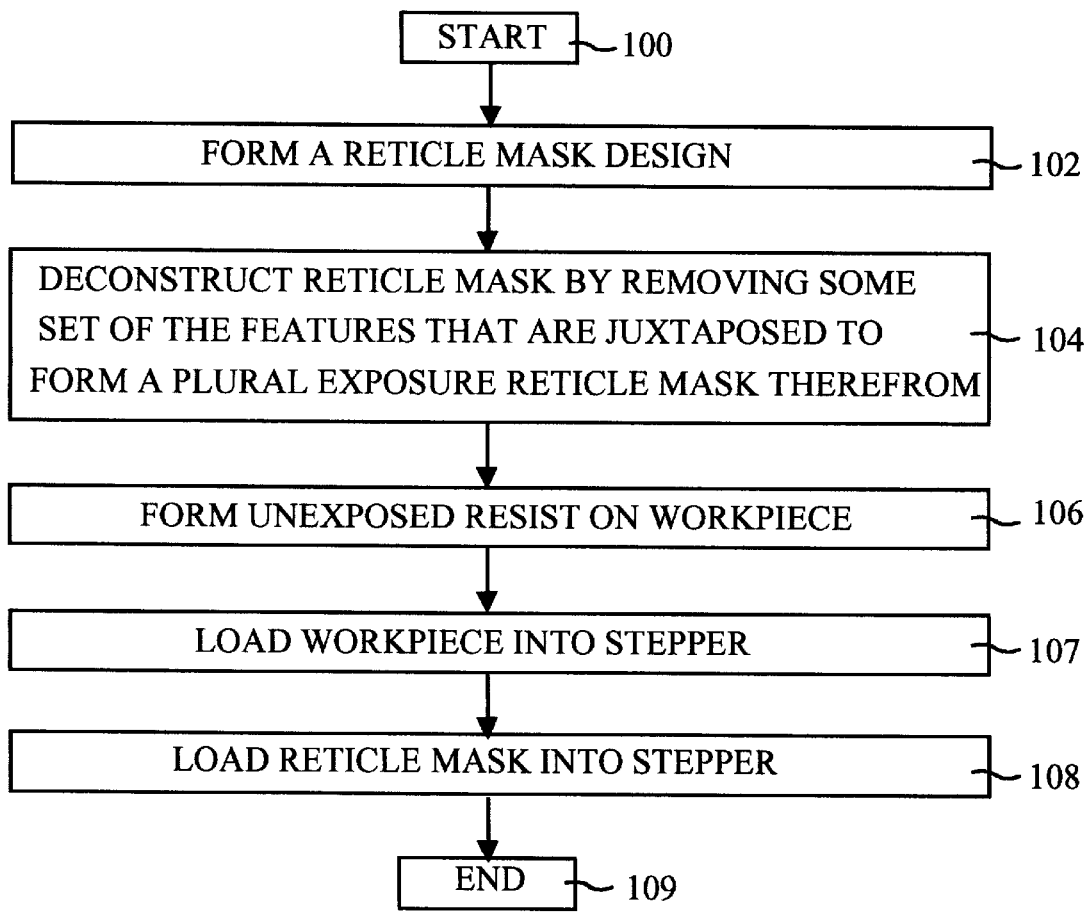
FIG. 11 is a flow chart which shows steps of the process for forming a plural exposure reticle mask.

FIG. 11 is a flow chart which shows steps of the process for forming a plural exposure reticle mask in accordance with this invention as follows:

1) In step 100 the process Starts;
2) In step 102, form a design for a reticle mask;
3) In step 104, deconstruct the design for the reticle mask by removing some set(s) of the features that are juxtaposed leaving a mask suitable for use in reconstructing the design by nanostepping the deconstructed reticle mask while making a series of exposures therethrough;
4) In step 106, form unexposed resist (e.g. photoresist reticle masking material) on workpiece;
5) In step 107, load the workpiece into stepper;
6) In step 108, load the reticle mask into stepper; and
7) In step 109 the process ENDs.

Dual Exposure Process

Figure 12:
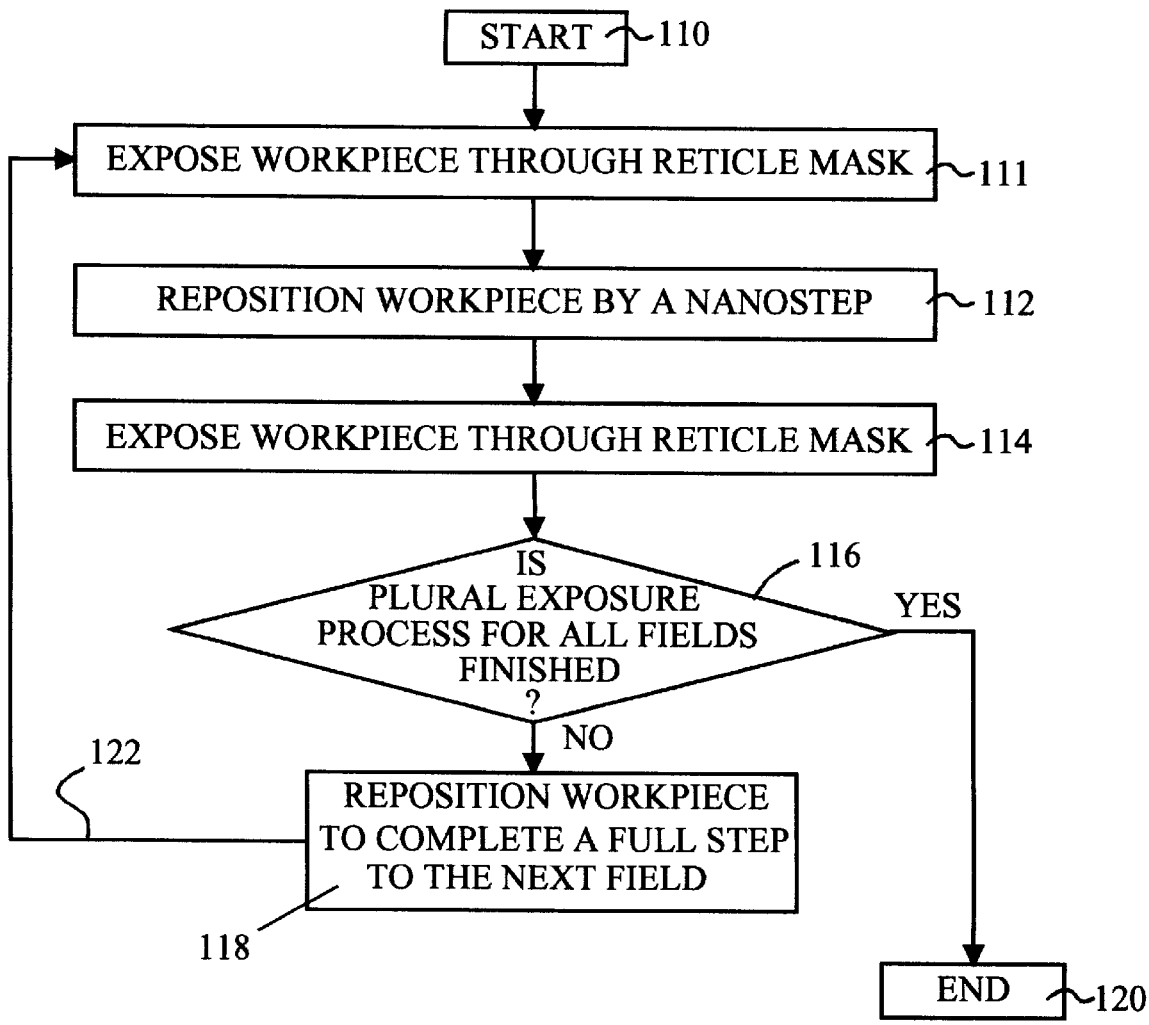
FIG. 12 is a flow chart which shows a dual exposure process.

FIG. 12 is a flow chart which shows a dual exposure process in accordance with this invention, as follows:

1) In step 111, expose workpiece through reticle mask;
2) In step 112, reposition workpiece by a nanostep;
3) In step 114, expose workpiece through reticle mask;
4) In step 116, a test is made which is "Is dual exposure finished?";
5) If the result of the test in step 116 is NO the process loops back along line 122 to step 111 to repeat the process from there; and
6) If the result of the test in step 116 is YES then the process goes to the END 120.

Alternatively, the workpiece can be fully exposed first by stepping a series of full steps from the start position to the end of the area to be exposed. Then go back to the starting position. Then make a nanostep to reset the starting position. At that point re-expose from the reset starting position in the same way with a series of full steps from the reset starting position which carries the nanostep offset forward.

Alternative Dual Exposure Process

Figure 13:
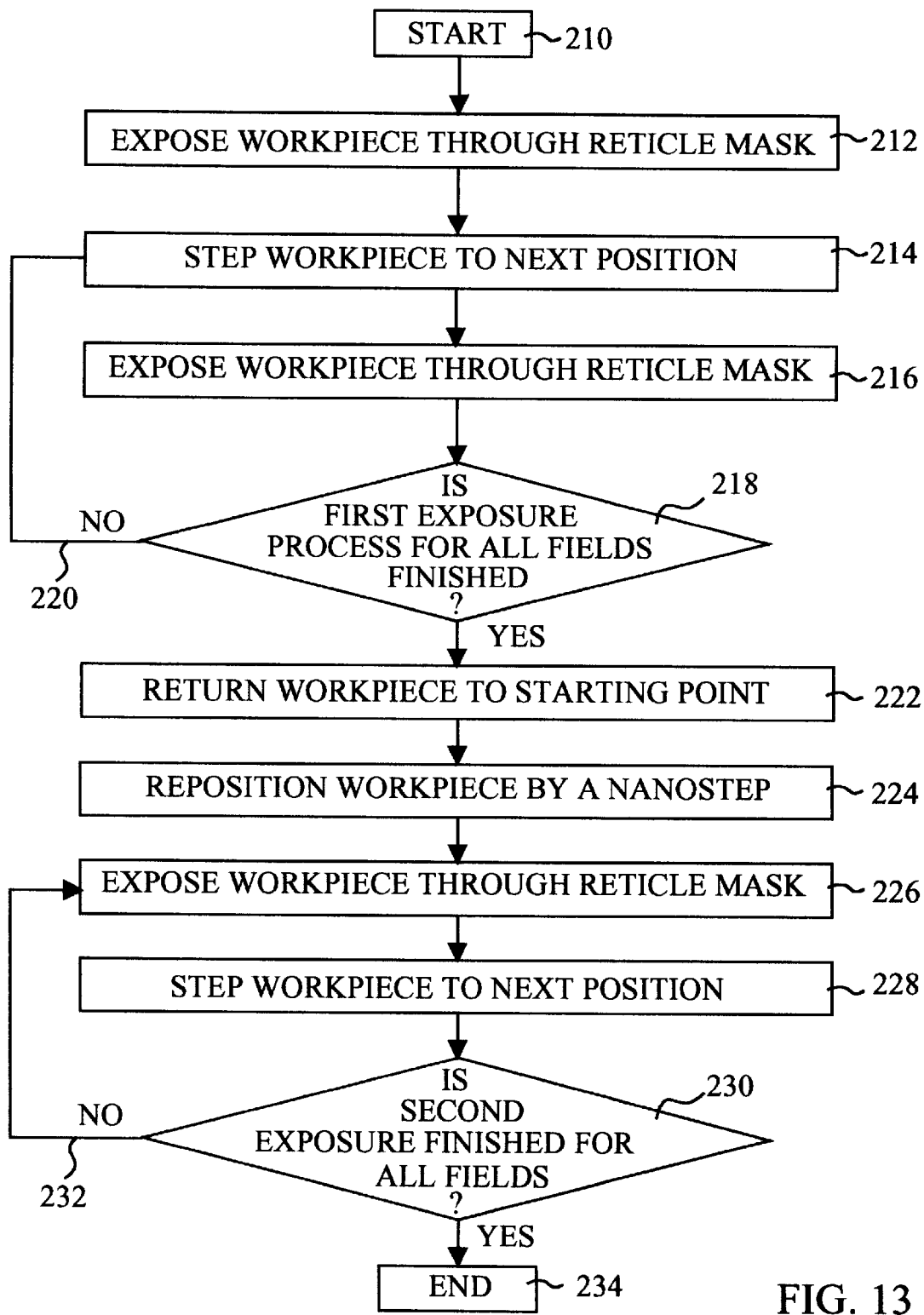
FIG. 13 is a flow chart which shows a dual exposure process which is a modification of FIG. 12 in which the nanostep is deferred until after a first exposure of the entire workpiece.

FIG. 13 is a flow chart which shows a dual exposure process in accordance with this invention which is a modification of FIG. 12 in which the nanostep is deferred until after a first exposure of the entire workpiece. Then the stepper is reset by a nanostep and the exposure continues as follows:

1) Starting the process at Start 210, in step 212, expose the workpiece through a plural exposure reticle mask;
2) In step 214, step the workpiece to the next position;
3) In step 216, expose workpiece through reticle mask;
4) In step 218, a test is made, which is "Is the first exposure process for all fields finished?";
5) If the result of the test in step 218 is NO the process loops back along line 220 to step 214 to repeat the process from there;

6) If the result of the test in step 218 is YES then the process goes to step 222;

7) In step 222, return the workpiece to the starting point or to the equivalent position reached after step 8) below;

8) In step 224, reposition workpiece by a nanostep;

9) In step 226, expose workpiece through reticle mask once again offset by the nanostep;

10) In step 228, step the workpiece to the next position;

11) In step 230, a test is made, which is "Is the second exposure finished for all fields?";

12) If the result of the test in step 230 is NO the process loops back along line 232 to step 226 to repeat the process from there; and 13) If the result of the test in step 230 is YES then the process goes to the END 234.

Additional Advantages of this Invention

Not only does the method of this invention produce patterns that are improved from an imaging point of view, but the method also lessens the burden on mask fabrication, since there is a larger distance between features.

Additional Alternative

It is also possible to use two separate masks rather than a stage shift.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method for printing an array of identical pattern elements in a microcircuit each pattern element having a length L with adjacent pattern elements being spaced apart by a distance M and with adjacent pattern elements repeating at an interval I in a scanning direction where I=L+M comprising the steps as follows:
   (a) form a mask comprising a fraction of the array of identical pattern elements spaced apart by more than one interval I in the scanning direction including staggered sets of identical polygonally-shaped clusters of the patterns,
   (b) expose a workpiece through the mask,
   (c) reposition the workpiece relative to the mask by a distance comprising a nanostep of at least one interval I in the scanning direction,
   (d) re-expose the workpiece through the mask,
   (e) reposition the workpiece relative to the mask by a distance comprising a step of a plurality of intervals I, and
   (f) return to perform steps (b) through (e) until the workpiece has been exposed.

2. The method of claim 1 wherein said polygonally-shaped clusters are selected from a diamond-shaped cluster and a hexagonally-shaped cluster.

3. The method of claim 1 wherein said polygonally-shaped clusters are diagonally staggered on the mask, and each cluster has a gap in the center of the cluster.

4. The method of claim 1 wherein as follows:
   said polygonally-shaped clusters are selected from a diamond-shaped cluster and a hexagonally-shaped cluster, and
   said polygonally-shaped clusters are diagonally staggered on the mask and each cluster has a gap in the center of the cluster.

5. A method for printing an array of identical pattern elements with each pattern element having a length L with adjacent pattern elements being spaced apart by a distance M and with adjacent pattern elements repeating at an interval I in a scanning direction where I=L+M in a microcircuit comprising the steps as follows:
   (a) form a mask comprising a fraction of the array of identical pattern elements spaced apart by more than one interval I in the scanning direction including staggered sets of identical polygonally-shaped clusters of the patterns,
   (b) expose a workpiece through the mask,
   (c) reposition the workpiece relative to the mask by a distance comprising a step of at least one interval I in the scanning direction,
   (d) re-expose the workpiece through the mask and repeating steps (b) and (c) until the workpiece has been exposed once,
   (e) return the workpiece to the start position,
   (f) reposition the workpiece relative to the mask by a distance comprising a nanostep of at least one interval I in the scanning direction,
   (g) re-expose the workpiece through the mask,
   (h) reposition the workpiece relative to the mask by a distance comprising a step, and
   (i) return to perform steps (g) through (h) until the workpiece has been re-exposed.

6. The method of claim 5 wherein said polygonally-shaped clusters are selected from a diamond-shaped cluster and a hexagonally-shaped cluster.

7. The method of claim 5 wherein said polygonally-shaped clusters are diagonally staggered on the mask, and each cluster has a gap in the center of the cluster.

8. The method of claim 5 wherein as follows:
   said polygonally-shaped clusters are selected from a diamond-shaped cluster and a hexagonally-shaped cluster, and
   said polygonally-shaped clusters are diagonally staggered on the mask and each cluster has a gap in the center of the polygon.

9. A method for exposing a workpiece by printing an array of identical pattern elements in an array of identical pattern elements spaced apart by more than one interval I in a microcircuit, with each pattern element having a length L and with adjacent pattern elements being spaced apart by a distance M and with adjacent pattern elements repeating at an interval I in a scanning direction where I=L+M in a dual exposure step-and-repeat process by the steps as follows:
   (a) form a design for a reticle mask with an array of features,
   (b) deconstruct the design for the reticle mask by removing features that are juxtaposed spaced apart by a plurality of distances M to form a mask comprising a fraction of the array including staggered sets of identical polygonally-shaped clusters of the patterns,
   (c) form unexposed resist on the workpiece;
   (d) load the workpiece and the reticle mask into the stepper;

(e) expose the workpiece through the reticle mask (111);

(f) reposition the workpiece by a nanostep (112, 224) of at least one interval I in the scanning direction; and (g) expose the workpiece through the reticle mask after the repositioning (114, 226).

10. The method of claim 9 wherein the steps are performed after step (e) as follows:

(h) then step the workpiece to a next position (214) spaced apart by a plurality of distances M, (i) then expose the workpiece through the reticle mask (216);

(j) test whether the plural exposure process is finished (218);

(k) if the result of the test in step (j) is NO then loop back to step (h) to repeat the process from there (220, 214);

(l) if the result of the test in step (h) is YES then return the workpiece to starting point (222) and (m) perform step (f) by repositioning the workpiece by a nanostep (224), (n) perform step (g) expose the workpiece through the reticle mask after the repositioning (226), (o) step the workpiece to a next position (228), (p) after step (o) test whether the second exposure process is finished for all fields (230);

(q) if the result of the test in step (p) is NO the process loops back to step (o) to repeat step (o) and repeat step (p);

(r) if the result of the test in step (p) is YES the process comes to an end (234).

11. A method for exposing a workpiece by printing an array of identical pattern elements in a microcircuit each pattern element having a length L with adjacent pattern elements being spaced apart by a distance M and with adjacent pattern elements repeating at an interval I in a scanning direction where I=L+M in a plural exposure step-and-repeal process by the steps as follows:

(a) form a design for a reticle mask with an array of features in a row;

(b) deconstruct the design for the reticle mask by removing alternate ones of features that are juxtaposed in the row leaving an interval I in the mask without a pattern element to be printed onto the workpiece;

(c) form unexposed resist on the workpiece;

(d) load the workpiece and the reticle mask into the stepper;

(e) expose the workpiece through the reticle mask (111), (f) reposition the workpiece by a nanostep (112, 224) of at least one interval I in the scanning direction; and (g) expose the workpiece through the reticle mask after the repositioning (114, 226).

12. The method of claim 1 wherein the steps are performed after step (e) as follows:

(h) step the workpiece to a next position (214) spaced apart by a plurality of distances M, (i) expose the workpiece through the reticle mask (216);

(j) test whether the plural exposure process is finished (218);

(k) if the result of the test in step (j) is NO then loop back to step (h) to repeat the process from there (220, 214);

(m) if the result of the test in step (j) is YES then return the workpiece to starting point (222) and (n) perform step (g) by repositioning the workpiece by a nanostep (224), (o) perform step (h) expose the workpiece through the reticle mask after the repositioning (226), (p) step the workpiece to a next position (228), (p) after step (o) test whether the second exposure process is finished for all fields (230);

(q) if the result of the test in step (p) is NO the process loops back to step (o) to repeat step (o) and repeat step (p); and (r) if the result of the test in step (p) is YES the process comes to an end (234).

13. The method of claim 12 wherein said polygonally-shaped clusters are selected from a diamond-shaped cluster and a hexagonally-shaped cluster.

14. The method of claim 12 wherein said polygonally-shaped clusters are diagonally staggered on the mask, and each cluster has a gap in the center of the cluster.

15. The method of claim 12 wherein as follows:

said polygonally-shaped clusters are selected from a diamond-shaped cluster and a hexagonally-shaped cluster, and said polygonally-shaped clusters are diagonally staggered on the mask and each cluster has a gap in the center of the polygon.

* * * * *